(12) United States Patent
Wu

(10) Patent No.: US 11,411,207 B2
(45) Date of Patent: Aug. 9, 2022

(54) DISPLAY PANEL AND METHOD OF MANUFACTURING SAME

(71) Applicant: Wuhan China Star Optoelectronics Semiconductor Display Technology Co., Ltd., Wuhan (CN)

(72) Inventor: Junjie Wu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 222 days.

(21) Appl. No.: 16/753,850

(22) PCT Filed: Feb. 20, 2020

(86) PCT No.: PCT/CN2020/075984
§ 371 (c)(1),
(2) Date: Apr. 6, 2020

(87) PCT Pub. No.: WO2021/098067
PCT Pub. Date: May 27, 2021

(65) Prior Publication Data
US 2021/0408506 A1    Dec. 30, 2021

(30) Foreign Application Priority Data
Nov. 22, 2019  (CN) .......................... 201911157302.9

(51) Int. Cl.
*H01L 51/56* (2006.01)
*H01L 27/32* (2006.01)
*H01L 51/00* (2006.01)

(52) U.S. Cl.
CPC .......... *H01L 51/56* (2013.01); *H01L 27/3211* (2013.01); *H01L 27/3246* (2013.01);
(Continued)

(58) Field of Classification Search
CPC ................. H01L 51/56; H01L 51/0011; H01L 51/00123; H01L 27/3211; H01L 27/3246; H01L 2227/323
(Continued)

(56) References Cited
U.S. PATENT DOCUMENTS

2018/0226508 A1* 8/2018 Chen .................... H01L 27/3274
2018/0247984 A1* 8/2018 Wang .................. H01L 27/3218
(Continued)

FOREIGN PATENT DOCUMENTS

CN    106373985    2/2017
CN    106653768    5/2017
(Continued)

OTHER PUBLICATIONS

English Machine Translation of CN 110453173 (Year: 2019).*

*Primary Examiner* — Dzung Tran

(57) ABSTRACT

A display panel and a method of manufacturing the display panel are provided. The display panel includes an array substrate, a pixel definition layer, and spacers. Each of spacers includes a bottom surface and a top surface. A cross-sectional area of the top surface is less than a cross-sectional area of the bottom surface. A horizontal distance from a center to a side of the spacer gradually increases from the top surface to the bottom surface. Moreover, holes of the mask plate corresponding to positions of the spacers are defined, which ensures accuracy of photolithography and display effect of the display panel.

9 Claims, 3 Drawing Sheets

(52) U.S. Cl.
CPC ...... *H01L 51/0011* (2013.01); *H01L 51/0012* (2013.01); *H01L 2227/323* (2013.01)

(58) Field of Classification Search
USPC .......................................................... 438/35
See application file for complete search history.

(56) References Cited

U.S. PATENT DOCUMENTS

| | | | | |
|---|---|---|---|---|
| 2018/0287064 | A1* | 10/2018 | Matsueda | C23C 16/56 |
| 2019/0123308 | A1* | 4/2019 | Zheng | H01L 51/5221 |
| 2019/0131358 | A1* | 5/2019 | Yang | H01L 27/3218 |
| 2019/0326359 | A1* | 10/2019 | Yang | G06F 3/0443 |
| 2019/0355801 | A1* | 11/2019 | Yang | H01L 27/3246 |

FOREIGN PATENT DOCUMENTS

| | | |
|---|---|---|
| CN | 109065583 | 12/2018 |
| CN | 109065616 | 12/2018 |
| CN | 110453173 | 11/2019 |

\* cited by examiner

DISPLAY PANEL AND METHOD OF MANUFACTURING SAME

RELATED APPLICATIONS

This application is a National Phase of PCT Patent Application No. PCT/CN2020/075984 having International filing date of Feb. 20, 2020, which claims the benefit of priority of Chinese Patent Application No. 201911157302.9 filed on Nov. 22, 2019. The contents of the above applications are all incorporated by reference as if fully set forth herein in their entirety.

FIELD AND BACKGROUND OF THE OF THE INVENTION

The present disclosure relates to the field of display technologies, and in particular, to a display panel and a method of manufacturing the display panel.

Organic light-emitting device (OLED) displays have advantages of self-luminescence, fast response times, light weight, and thinness, compared to liquid crystal display devices, and have become an emerging technology in the display field.

In manufacturing process of display panels, a fine metal mask (FMM) technique is used. Organic material vapor-deposition process refers to a process in which an organic light-emitting material is vapor-deposited in specific pixels of a backplane by using the FMM technique to form a specific light-emitting device, and red (R)/green (G)/blue (B) full-color OLED displays can be realized. Current FMM technique of the display panels typically consists of a plurality of sub-mask plates which are spliced together. Its precision requirements are high, and positioning spacers are usually provided on the display panels to ensure alignment accuracy of a mask plate. However, in current mask plate structure and the FMM technique, holes of the FMM mask plate are extremely small. During vapor-deposition, the holes of the FMM and pixels of a base substrate cannot be completely aligned, and the mask plate cannot be accurately placed on the positioning spacers. After the display panel is vapor-deposited, pixel resolution is reduced, which further affects display effect.

Therefore, it is necessary to provide a solution to the problems in the conventional art.

Technical Problem

In summary, in current display panels, mask plate structure, and FMM technique, the holes of the FMM mask are small. During vapor-deposition, the mask plate cannot be accurately positioned, and the holes of the FMM and the pixels cannot be completely aligned, resulting in low pixel resolution of the display panel and poor display effect.

SUMMARY OF THE INVENTION

Technical Solutions

In order to solve the above problems, the present disclosure provides a display panel and a method of manufacturing the display panel, so as to solve the problem that in conventional display panel and fine metal mask (FMM) technique, a mask plate cannot be accurately positioned, holes of the FMM and pixels cannot be completely aligned during an vapor-deposition process, and pixel resolution is low and display effect of the display panels is poor.

To solve the above technical problems, the technical solutions provided by the embodiments of the present disclosure are as follows.

According to a first aspect of the embodiments of the present disclosure, a display panel is provided, including:
an array substrate;
a pixel definition layer disposed on the array substrate; and
a plurality of spacers disposed on the pixel definition layer;
wherein each of the spacers includes a bottom surface and a top surface, a cross-sectional area of the top surface is less than a cross-sectional area of the bottom surface, and a horizontal distance from a center to a side of each of the spacers increases gradually from the top surface to the bottom surface; and
the spacers are arranged in a square array on the pixel definition layer, and the spacers are defined with a draft taper.

According to an embodiment of the present disclosure, a cross-sectional shape of the spacers includes square.

According to an embodiment of the present disclosure, a cross-sectional shape of the spacers includes circular.

According to an embodiment of the present disclosure, each of the spacers is disposed on a non-aperture region of a pixel of the display panel.

According to a second aspect of the embodiments of the present disclosure, another display panel is provided, including:
an array substrate;
a pixel definition layer disposed on the array substrate; and
a plurality of spacers disposed on the pixel definition layer;
wherein each of the spacers includes a bottom surface and a top surface, a cross-sectional area of the top surface is less than a cross-sectional area of the bottom surface, and a horizontal distance from a center to a side of each of the spacers increases gradually from the top surface to the bottom surface.

According to an embodiment of the present disclosure, a cross-sectional shape of the spacers includes square.

According to an embodiment of the present disclosure, a cross-sectional shape of the spacers includes circular.

According to an embodiment of the present disclosure, the spacers are arranged in a square array on the pixel definition layer.

According to a second aspect of the embodiments of the present disclosure, a method of manufacturing the display panel is further provided, including following steps: S100, fabricating a base substrate, an array substrate, and a pixel definition layer of the display panel;
S101, fabricating a plurality of spacers on the pixel definition layer;
S102, forming a plurality of holes on a mask plate corresponding to positions of the spacers by a fine metal mask plate evaporation technology; and
S103, aligning the mask plate with the spacers and performing a vapor deposition process.

According to an embodiment of the present disclosure, the step S100 further includes forming a plurality of openings in a pixel effective region of the pixel definition layer by a photolithography process.

According to an embodiment of the present disclosure, a cross-sectional shape of the spacers includes circular.

According to an embodiment of the present disclosure, a cross-sectional shape of the spacers includes square.

According to an embodiment of the present disclosure, a side of each of the spacers has a slope.

According to an embodiment of the present disclosure, the holes of the mask plate include through holes or blind holes in the step S102.

According to an embodiment of the present disclosure, a diameter of the holes of the mask plate is less than 12 um.

According to an embodiment of the present disclosure, the holes of the mask plate corresponding to positions of the spacers include through holes and blind holes in the step S102.

According to an embodiment of the present disclosure, a height of the spacers corresponding to the through holes is greater than a height of the spacers corresponding to the blind holes.

According to an embodiment of the present disclosure, after an alignment of the mask plate and the spacers is completed in the step S103, red pixels, blue pixels, and green pixels are vapor-deposited through the mask plate, respectively.

Beneficial Effect

In summary, the beneficial effects of the embodiments of the present disclosure are as follows.

The present disclosure provides a display panel and a method of manufacturing the display panel. Spacers are photolithographed on a pixel definition layer of the display panel, and holes of a mask plate are formed in positions corresponding to the spacers. The holes of the mask plate and the spacers are aligned with each other during vapor-deposition of pixels, which ensures corresponding accuracy of the mask plate, thereby ensuring the accuracy of vapor-deposition, improving aperture ratio of the pixels and pixel resolution, and improving the display effect.

DETAILED DESCRIPTION OF SPECIFIC EMBODIMENTS OF THE INVENTION

The following descriptions of the embodiments are made with reference to the attached drawings to illustrate specific embodiments that the present disclosure can be implemented.

Figure 1:
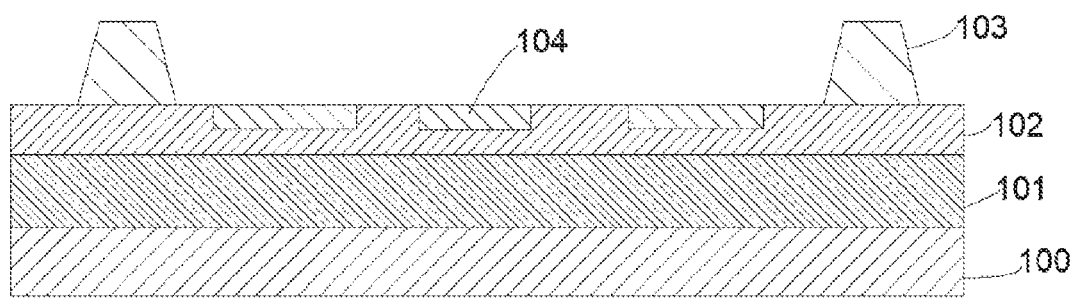
FIG. 1 is a schematic structural diagram of each layer of a display panel according to an embodiment of the present disclosure.

In an embodiment of the present disclosure, as shown in FIG. 1, FIG. 1 is a schematic structural diagram of each layer of a display panel according to an embodiment of the present disclosure. The display panel includes a base substrate 100, an array substrate layer 101, a pixel definition layer 102, and a plurality of spacers 103. The array substrate layer 101 is disposed on the base substrate 100, the pixel definition layer 102 is disposed on the array substrate layer 101, and the spacers 103 are disposed on the pixel definition layer 102. A plurality of pixel openings 104 are further defined in the pixel definition layer 102. The pixel openings 104 are specifically set according to the display requirements of the display panel. The pixel openings 104 are formed by a photolithography process. Red pixels, blue pixels, and green pixels are disposed in the pixel opening 104 to ensure color display of the display panel.

Specifically, the array substrate layer 101 further includes a buffer layer, a first gate insulating layer, a second gate insulating layer, an inorganic insulating layer, a planarization layer, and a functional layer of the display panel etched in each film layer.

The spacers 103 are arranged in a square array on the pixel definition layer 102, and can be specifically disposed on a non-aperture region of a pixel to prevent affecting light emitting condition of the pixel.

Figure 2:
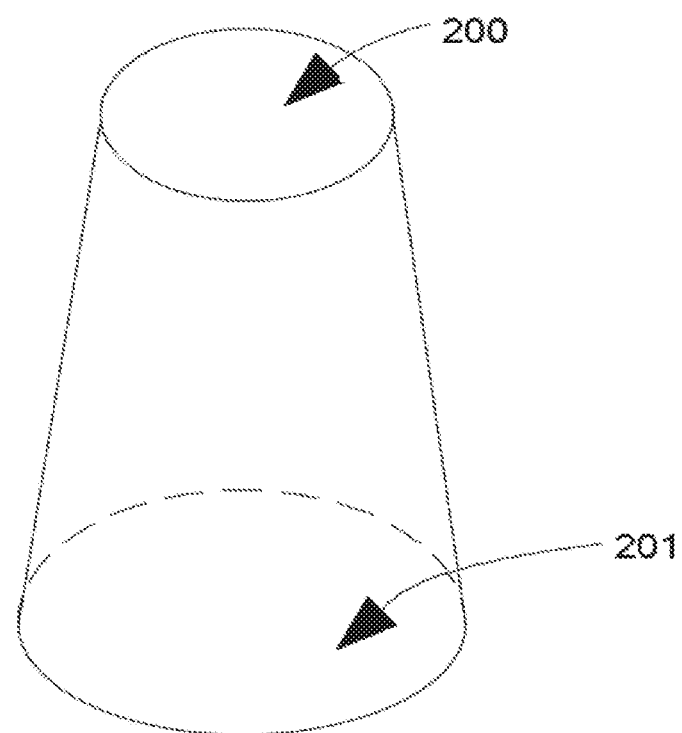
FIG. 2 is a schematic structural diagram of a spacer according to an embodiment of the present disclosure.

Specifically, as shown in FIG. 2, FIG. 2 is a schematic structural diagram of a spacer according to an embodiment of the present disclosure. The spacer includes a top surface 200 and a bottom surface 201.

The top surface 200 can also be concentrated into a vertex, in this case, the spacer is a cone. A cross-sectional shape of the spacer is circular. A cross-sectional area of the top surface 200 is less than a cross-sectional area of the bottom surface 201, and a side of the spacer has a draft taper, that is, a horizontal distance from a center to the side of the spacer increases gradually from the top surface 200 to the bottom surface 201. In this way, when the spacers are matched with a mask plate, the spacers with a slope can easily be matched with holes in the mask plate to improve the process efficiency.

Preferably, the cross-sectional shape of the spacer can also be square, and a side length of the top surface is less than a side length of the bottom surface. Specifically, in order to ensure the fitting accuracy, the side length of the square top surface is set to 5 um, the side length of the bottom surface is set to 19 um, and a height of the spacer is set to 7 um.

Figure 3:
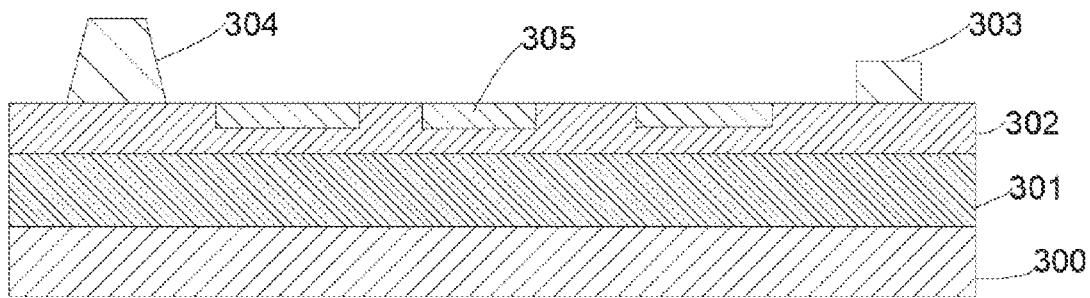
FIG. 3 is a schematic structural diagram of a display panel according to another embodiment of the present disclosure.

As shown in FIG. 3, FIG. 3 is a schematic structural diagram of a display panel according to another embodiment of the present disclosure. The display panel includes a base substrate 300, an array substrate layer 301, a pixel definition layer 302, a first spacer 303, a second spacer 304, and a plurality of pixel units 305. The array substrate layer 301 is disposed on the base substrate 300, the pixel definition layer 302 is disposed on the array substrate layer 301, and the first spacer 303 and the second spacer 304 are disposed on the pixel definition layer 302.

Compared with FIG. 1, the embodiment of the present disclosure is different in that the first spacer 303 is different from the second spacer 304. A height of the first spacer 303 is greater than a height of the second spacer 304. Different photomasks are used for photolithographing the first spacer 303 and the second spacer 304. Preferably, the first spacer is set in a square shape, a side length of a top surface of the second spacer 304 is 1 um, a side length of the bottom surface is 16 um, and a height of the second spacer 304 is 7 um. In a mask plate matching the second spacer, a diameter of holes of the mask plate is set to a maximum of 12 um. In this way, when positioning the mask plate, the mask plate is first aligned with the second spacer 304. After the second spacer 304 is aligned, it is aligned with the first spacer 303 having a lower height. The two kinds of spacers can firmly fix the mask plate, and ensure the photolithographic accuracy during photolithography.

Figure 4:
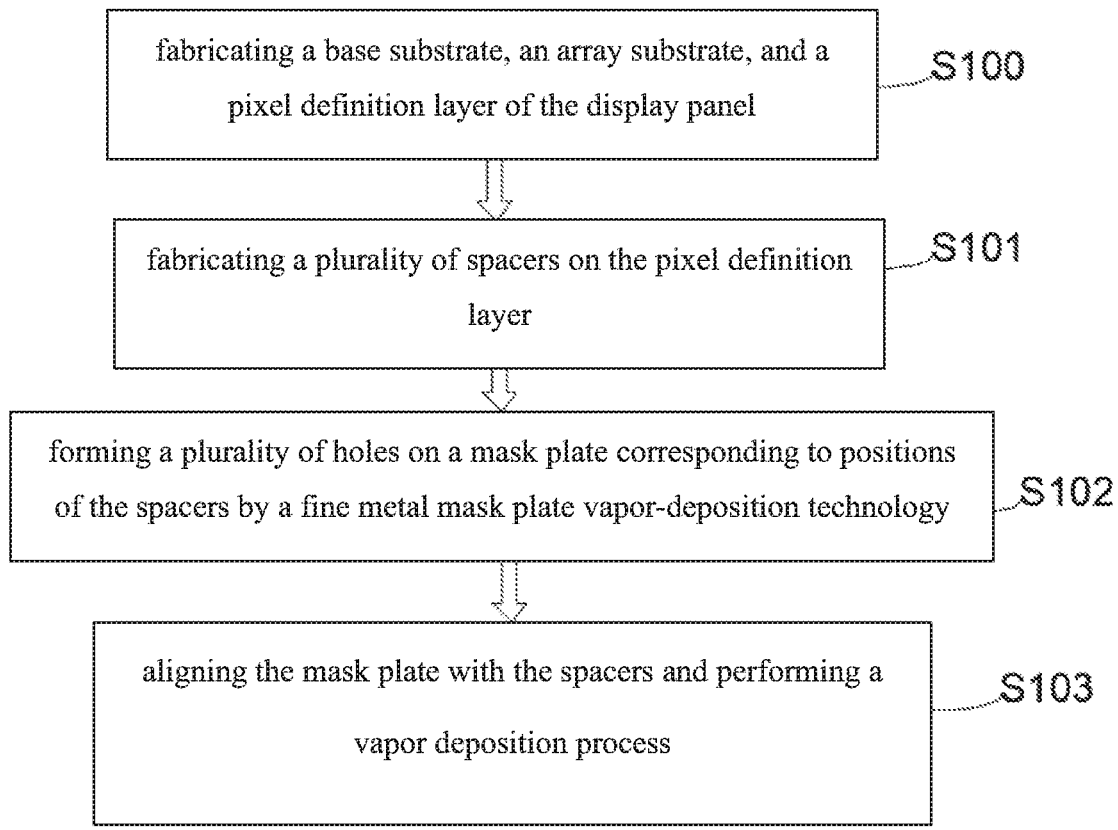
FIG. 4 is a manufacturing flowchart of a display panel according to an embodiment of the present disclosure.

An embodiment of the present disclosure further provides a method of manufacturing a display panel. As shown in FIG. 4, FIG. 4 is a manufacturing flowchart of a display panel according to an embodiment of the present disclosure. The method of manufacturing the display panel includes following steps:

S100, fabricating a base substrate, an array substrate, and a pixel definition layer of the display panel.

First, a conventional OLED manufacturing process is used to fabricate the base substrate of the display panel and the array substrate on the base substrate. After the array substrate is fabricated, the pixel definition layer is deposited. Typical OLED manufacturing processes include a chemical vapor deposition process, a physical vapor deposition process, and a photolithography process. After the above-mentioned film layers are fabricated, it is also necessary to use a pre-made mask plate to fabricate a plurality of pixel openings through a photolithography process on the pixel definition layer, and a plurality of pixel units are subsequently arranged in the pixel openings.

S101, fabricating a plurality of spacers on the pixel definition layer.

In the embodiment of the present disclosure, the function of the spacers is to position and fix the mask plate. If the mask plate is not positioned accurately during photolithography, an aperture ratio of the fabricated pixel units is not high, and the display effect is poor during display. When the spacers are set, the cross-sectional shape of the spacers can be circular or square, and each of the spacers has a certain draft taper. In this way, when the spacers are matched with the mask plate, it is easy for the spacers to be inserted inside the holes of the mask plate.

S102, forming a plurality of holes on a mask plate corresponding to positions of the spacers by a fine metal mask plate evaporation technology.

The embodiment of the present disclosure further includes a mask plate, and the mask plate is matched with the spacers in the step S101. The holes are formed on the mask plate at positions corresponding to the spacers. The holes include through holes or blind holes, or both types of holes are defined at the same time.

Figure 5:
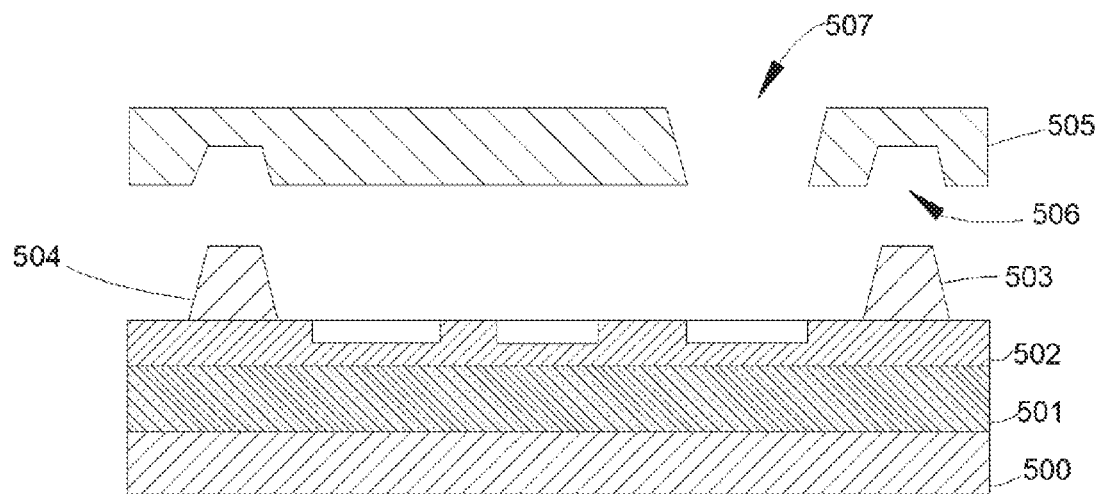
FIG. 5 is a schematic diagram of photolithography according to an embodiment of the present disclosure.

Specifically, as shown in FIG. 5, FIG. 5 is a schematic diagram of photolithography according to an embodiment of the present disclosure. The display panel includes a base substrate 500, an array substrate 501, a pixel definition layer 502, a first spacer 503, and a second spacer 504, which are sequentially disposed. Each film layer of the display panel is fabricated by a conventional manufacturing process.

In the meantime, a precision mask plate 505 is also included in the photolithography process. The mask plate 505 includes a plurality of openings 506 and a plurality of second holes 507. The second holes 507 are mainly to fabricate a plurality of aperture regions on the pixel definition layer. A photoresist is coated on the second holes 507 and illuminated to obtain pixel openings on the pixel definition layer.

In step S101, the first spacer 503 and the second spacer 504 have been fabricated on the display panel. The openings 506 are defined in the mask plate 505 at positions corresponding to the spacers, and the openings 506 can be through holes or blind holes. Moreover, the openings have a certain slope. Preferably, a maximum side length of the bottom of the openings 506 is 12 um. In this way, the spacers are conveniently matched and positioned with the openings to ensure photolithographic accuracy.

Figure 6:
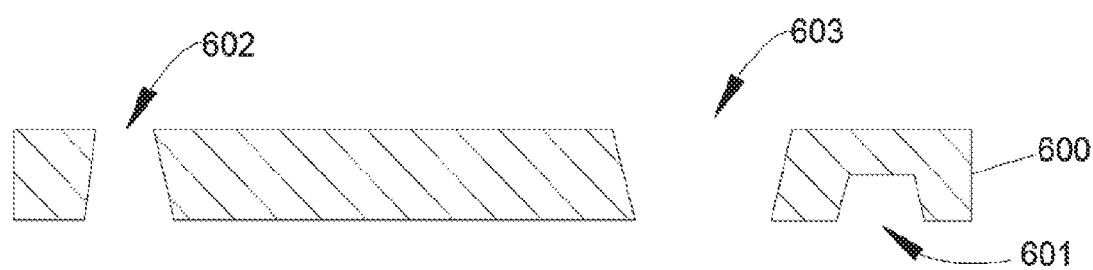
FIG. 6 is a schematic cross-sectional view of a mask plate according to an embodiment of the present disclosure.

Specifically, as shown in FIG. 6, FIG. 6 is a schematic cross-sectional view of a mask plate according to an embodiment of the present disclosure. The mask plate 600 includes a first hole 601, a second hole 602, and a third hole 603. In the embodiment of the present disclosure, the first hole 601 is a blind hole, and the second hole 602 is a through hole. Since heights of two holes of the first hole 601 and the second hole 602 are different, the height of the spacer corresponding to the position of the through hole is greater than the height of the spacer corresponding to the position of the blind hole. When the spacers are matched, it is easier to locate and more convenient to define. In the meantime, only one through hole can be defined, that is, the height of the first hole 601 is set to 0 um.

S103, aligning the mask plate with the spacers and performing a vapor deposition process.

After the positioning is completed, red pixels, blue pixels, and green pixels are vapor-deposited, respectively.

Finally, the display panel in the embodiment of the present disclosure is obtained.

The display panel and the method of manufacturing the display panel according to the embodiments of the present disclosure have been described in detail above. The technical scope of the present invention is not limited to the above description, a person skilled in the art can make various modifications and changes to the above embodiments without departing from the technical idea of the present invention, and such variations and modifications are intended to be within the scope of the invention.

What is claimed is:

1. A method of manufacturing a display panel, comprising following steps:
   S100, fabricating a base substrate, an array substrate, and a pixel definition layer of the display panel;
   S101, fabricating a plurality of spacers on the pixel definition layer;
   S102, forming a plurality of holes on a mask plate corresponding to positions of the spacers by a fine metal mask plate evaporation technology, wherein the holes of the mask plate corresponding to positions of the spacers comprise through holes and blind holes; and
   S103, aligning the mask plate with the spacers and performing a vapor deposition process.

2. The method of manufacturing the display panel according to claim 1, wherein the step S100 further comprises forming a plurality of openings in a pixel effective region of the pixel definition layer by a photolithography process.

3. The method of manufacturing the display panel according to claim 1, wherein a cross-sectional shape of the spacers includes circular.

4. The method of manufacturing the display panel according to claim 1, wherein a cross-sectional shape of the spacers includes square.

5. The method of manufacturing the display panel according to claim 1, wherein a side of each of the spacers has a slope.

6. The method of manufacturing the display panel according to claim 1, wherein the holes of the mask plate comprise through holes or blind holes in the step S102.

7. The method of manufacturing the display panel according to claim 6, wherein a diameter of the holes of the mask plate is less than 12 um.

8. The method of manufacturing the display panel according to claim 1, wherein a height of the spacers corresponding to the through holes is greater than a height of the spacers corresponding to the blind holes.

9. The method of manufacturing the display panel according to claim 1, wherein after an alignment of the mask plate and the spacers is completed in the step S103, red pixels, blue pixels, and green pixels are vapor-deposited through the mask plate, respectively.

\* \* \* \* \*

UNITED STATES PATENT AND TRADEMARK OFFICE
CERTIFICATE OF CORRECTION

| | |
|---|---|
| PATENT NO. | : 11,411,207 B2 |
| APPLICATION NO. | : 16/753850 |
| DATED | : August 9, 2022 |
| INVENTOR(S) | : Junjie Wu |

It is certified that error appears in the above-identified patent and that said Letters Patent is hereby corrected as shown below:

On the Title Page

In item (73) Assignee:
"Wuhan China Star Optoelectronics Semiconduetor Display Technology Co., Ltd."

Should be changed to:
--Wuhan China Star Optoelectronics Semiconductor Display Technology Co., Ltd.--

Signed and Sealed this
Twenty-first Day of February, 2023

Katherine Kelly Vidal
*Director of the United States Patent and Trademark Office*